(12) United States Patent
Lin (10) Patent No.: US 10,957,589 B2
(45) Date of Patent: Mar. 23, 2021

(54) SELF-ALIGNED CONTACT AND METHOD FOR FORMING THE SAME

(71) Applicant: MediaTek Inc., Hsin-Chu (TW)

(72) Inventor: Hsien-Hsin Lin, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 16/175,556

(22) Filed: Oct. 30, 2018

(65) Prior Publication Data

US 2019/0164830 A1 May 30, 2019

Related U.S. Application Data

(60) Provisional application No. 62/592,543, filed on Nov. 30, 2017.

(51) Int. Cl.
| | | |
|---|---|---|
| *H01L 27/105* | (2006.01) | |
| *H01L 21/768* | (2006.01) | |
| *H01L 21/311* | (2006.01) | |
| *H01L 29/66* | (2006.01) | |
| *H01L 21/033* | (2006.01) | |

(52) U.S. Cl.
CPC .... *H01L 21/76897* (2013.01); *H01L 21/0337* (2013.01); *H01L 21/31116* (2013.01); *H01L 29/6656* (2013.01); *H01L 29/66545* (2013.01)

(58) Field of Classification Search
CPC ............. H01L 27/0617; H01L 27/0705; H01L 27/085; H01L 27/088; H01L 27/10; H01L 27/105
See application file for complete search history.

(56) References Cited

U.S. PATENT DOCUMENTS

| | | | |
|---|---|---|---|
| 9,502,286 B2 | 11/2016 | Xie et al. | |
| 2006/0073699 A1* | 4/2006 | Lee | H01L 21/76897 |
| | | | 438/639 |
| 2013/0137257 A1 | 5/2013 | Wei et al. | |

(Continued)

FOREIGN PATENT DOCUMENTS

| | | |
|---|---|---|
| DE | 10 2004 020935 B3 | 9/2005 |
| TW | 200903730 A | 1/2009 |
| TW | 201208001 A | 2/2012 |

OTHER PUBLICATIONS

Extended European Search Report dated Apr. 1, 2019 in connection with European Application No. 18206639.9.
EP 18206639.9, Apr. 1, 2019, Extended European Search Report.

*Primary Examiner* — Jae Lee
(74) *Attorney, Agent, or Firm* — Wolf, Greenfield & Sacks, P.C.

(57) ABSTRACT

A method for forming a self-aligned contact includes providing a substrate with a plurality of gate structures including spacers on opposite sides. The method also includes forming a sacrificial layer between the gate structures. The method also includes forming a mask layer on a part of the sacrificial layer. The method also includes forming a plurality of first openings by removing the sacrificial layer exposed from the mask layer. The method also includes forming a dielectric layer in the plurality of first openings. The method also includes removing the mask layer. The method also includes forming a plurality of second openings by removing the sacrificial layer that remains on the substrate. The method also includes forming a plurality of first contact plugs in the second openings.

13 Claims, 11 Drawing Sheets

(56) References Cited

U.S. PATENT DOCUMENTS

2015/0235897 A1    8/2015   Fu et al.
2017/0194211 A1*   7/2017   Lai .................... H01L 21/76897
2017/0288031 A1*   10/2017   Ho .................... H01L 29/66545
2018/0308750 A1*   10/2018   Cheng ............... H01L 21/76883

* cited by examiner

SELF-ALIGNED CONTACT AND METHOD FOR FORMING THE SAME

CROSS REFERENCE TO RELATED APPLICATIONS

This application claims the benefit of U.S. Provisional Application No. 62/592,543 filed on Nov. 30, 2017, the entirety of which is incorporated by reference herein.

BACKGROUND

Technical Field

The disclosure relates to a semiconductor structure and more particularly to a self-aligned contact and a method for forming a self-aligned contact.

Description of the Related Art

The semiconductor integrated circuit industry has experienced rapid growth.

The development of integrated-circuit design and advancements in materials technology have produced generations of integrated circuits. Each generation has smaller and more complex circuits than the previous one. In the process of integrated-circuit development, geometric size has gradually reduced.

As integrated circuits have shrunk, the space between contact structures has decreased. Therefore, a self-aligned contact (SAC) process has been applied to prevent the contacts from short-circuiting. However, this may increase the capacitance between the gate and the drain (Cgd). Moreover, variations in the self-aligned contact structure may also cause a variation of the capacitance between the gate and the drain.

Although existing self-aligned contacts have generally been adequate for their intended purposes, they have not been entirely satisfactory in all respects, and need to be improved. This is especially true of the control of the capacitance between the gate and the drain with self-aligned contacts.

BRIEF SUMMARY

The present disclosure provides a method for forming a self-aligned contact. The method includes providing a substrate with a plurality of gate structures including spacers on opposite sides. The method also includes forming a sacrificial layer between the gate structures. The method also includes forming a mask layer on a part of the sacrificial layer. The method also includes forming a plurality of first openings by removing the sacrificial layer exposed from the mask layer. The method also includes forming a dielectric layer in the plurality of first openings. The method also includes removing the mask layer. The method also includes forming a plurality of second openings by removing the sacrificial layer that remains on the substrate. The method also includes forming a plurality of first contact plugs in the second openings.

The present disclosure also provides a self-aligned contact that includes a plurality of gate structures including spacers on opposite sides on a substrate. The self-aligned contact also includes a dielectric layer disposed between the gate structures. The self-aligned contact also includes a plurality of first contact plugs disposed between the gate structures in the dielectric layer. The spacer has a planar top surface.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-11A are cross-sectional representations of various stages of forming a self-aligned contact in accordance with some embodiments.

FIGS. 2B-11B are top views of various stages of forming a self-aligned contact in accordance with some embodiments.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Although some embodiments are discussed with operations performed in a particular order, these operations may be performed in another logical order. In different embodiments, additional operations can be provided before, during, and/or after the stages described the present disclosure.

Some of the stages that are described can be replaced or eliminated for different embodiments. Additional features can be added to the semiconductor structure in the present disclosure. Some of the features described below can be replaced or eliminated for different embodiments.

The embodiments of the present disclosure provide a method of forming a self-aligned contact. By forming a self-aligned sacrificial layer right where the contacts between the gate structures will be formed, the contacts formed later may be symmetrical and separate from the gate structures. Therefore, the capacitance between the gate and the drain may be reduced and have less variation.

Figure 1:
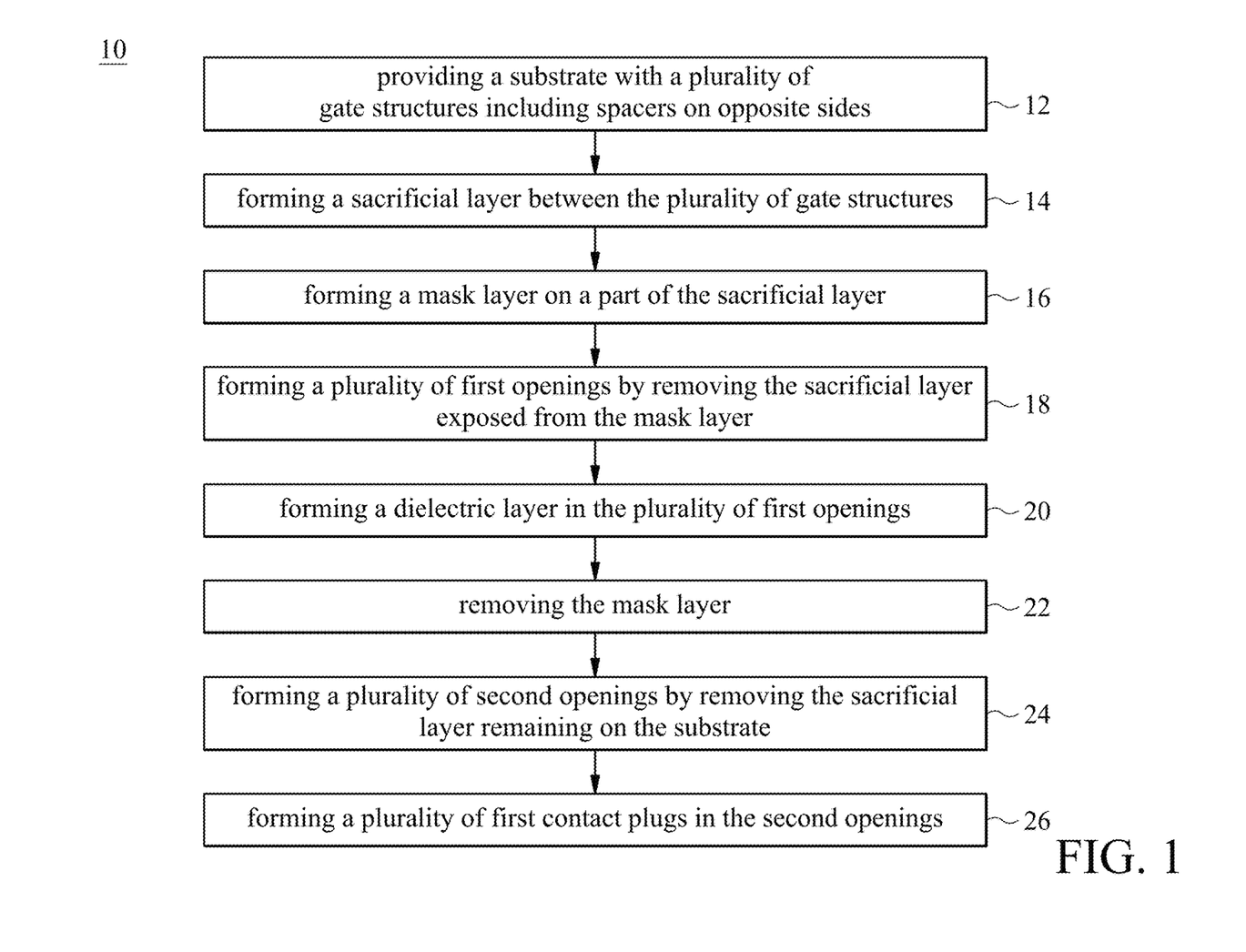
FIG. 1 is a flow chart of a method for forming a self-aligned contact in accordance with some embodiments.

FIG. 1 is a flow chart of a method 10 for forming a self-aligned contact 100 in accordance with some embodiments. FIGS. 2A-11A are cross-sectional representations of various stages of forming the self-aligned contact 100 in accordance with some embodiments of the present disclosure. FIGS. 2B-11B are top views of various stages of forming the self-aligned contact 100 in accordance with some embodiments of the present disclosure. Figures having the suffix "A" (e.g., FIG. 2A) are cross-sectional views of some embodiments of the self-aligned contact, taken along line A-A in the figures having the suffix "B" (e.g., FIG. 2B). In the following paragraphs, the embodiments of the present disclosure will be described with reference to the flowchart in FIG. 1 and the cross-sectional views illustrated in FIGS. 2A-11A along with the top views in FIGS. 2B-11B.

Figure 2A:
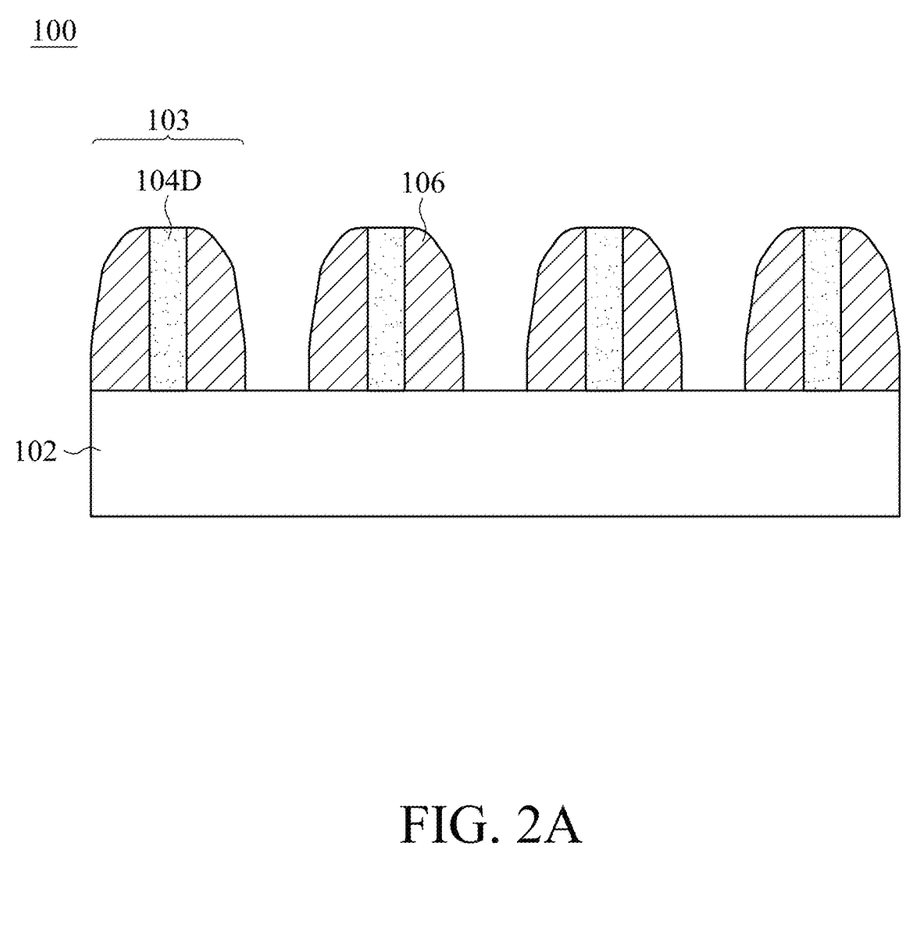
Figure 2B:
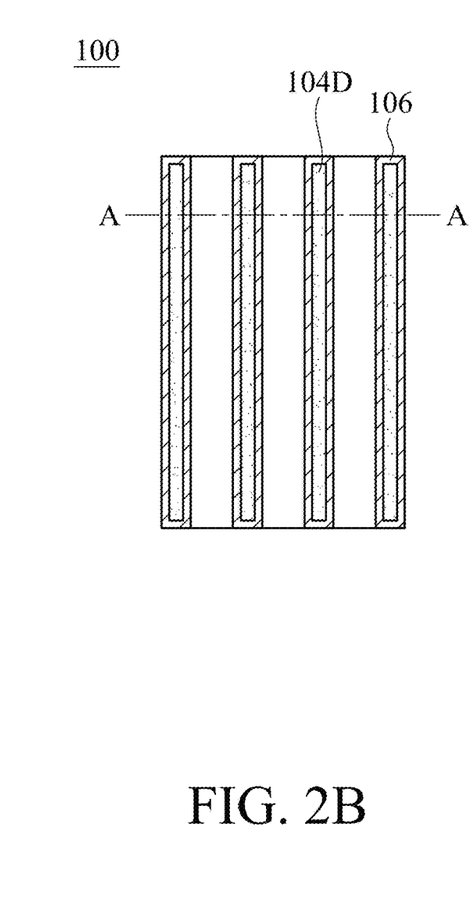

As shown in FIGS. 1, 2A, and 2B, the method 10 begins with step 12, in which a substrate 102 with a plurality of gate structures 103 is provided. The gate structures 103 include dummy gates 104D and spacers 106 formed on the opposite sides of the dummy gates 104D.

In some embodiments, the substrate 102 may be a semiconductor substrate such as a Si substrate. Moreover, the semiconductor substrate may also include other elementary semiconductors such as Ge; compound semiconductors such as GaN, SiC, GaAs, GaP, InP, InAs, and/or InSb; alloy semiconductors such as SiGe, GaAsP, AnnAs, AlGaAs, GaInAs, GaInP, and/or GaInAsP, or a combination thereof. In some embodiments, the substrate 102 has a first conductivity type. In some other embodiments, the substrate 102 has a second conductivity type. The second conductivity type is opposite to the first conductivity type. In some embodiments, the first conductivity type is P-type. For example, the substrate 102 may be a boron-doped substrate. In some other embodiments, the first conductivity type is N-type. For example, the substrate 102 may be a phosphorous-doped or arsenic-doped substrate. In some embodiments, the substrate 102 may also be semiconductor on insulator (SOI).

Next, gate structures 103 are formed on the substrate 102. The gate structures 103 include the dummy gates 104D and the spacers 106 formed on the opposite sidewalls of the dummy gates 104D. In some embodiments, the dummy gate 104D may include a dummy gate material layer and a dummy cap layer (not shown). The dummy gate material layer may include polycrystalline silicon, polycrystalline SiGe, amorphous silicon, microcrystal silicon, another suitable dummy gate material layer, or a combination thereof. The dummy cap layer may include silicon nitride. In some embodiments, the dummy gate material layer may be formed blanketly on the substrate 102 by chemical vapor deposition (CVD) (such as high density plasma chemical vapor deposition (HDPCVD), atmospheric pressure chemical vapor deposition (APCVD), low-pressure chemical vapor deposition (LPCVD), or plasma enhanced chemical vapor deposition (PECVD)), atomic layer deposition (ALD), physical vapor deposition (PVD), electroplating, spin-on coating, another suitable deposition process, or a combination thereof. The dummy cap layer may be formed blanketly on the dummy gate material layer by low-pressure chemical vapor deposition (LPCVD), plasma enhanced chemical vapor deposition (PECVD), another suitable deposition process, or a combination thereof.

After that, the dummy gate 104D is formed by a photolithography and etching process. The photolithography process may include photoresist coating (e.g., spin-on coating), soft baking, mask aligning, pattern exposure, post-exposure baking, photoresist development, and rinsing and drying (e.g., hard baking), etc. The etching process may include a dry etching process (e.g., reactive ion etching (RIE), anisotropic plasma etching method), a wet etching process, or a combination thereof.

In some embodiments, the spacers 106 are formed on the opposite sides of the dummy gates 104D. In some embodiments, the spacers 106 may include oxides, nitrides, oxynitrides, a high k material, a low k material, or a combination thereof. The precursor material or gaseous reactants of forming the spacers 106 may include TEOS (tetraethoxysilane), TRIES (triethoxysilane), BTBAS (bis(tert-butylamino) silane), $O_2$, $N_2O$, NO, other gas or materials, or a combination thereof. The spacers 106 may be conformally formed on the dummy gates 104D and the substrate 102 by LPCVD, PECVD, HDP-CVD, APCVD, ATD, another suitable deposition method, or a combination thereof. After that, an anisotropic etch-back is performed, and the spacers 106 are remained on the opposite sides of the dummy gate 104D. In some embodiments, the etch-back may be a dry etch process, which may be performed using an oxygen-containing gas, a fluorine-containing gas (such as $CF_4$, $SF_6$, $CH_2F_2$, $CHF_3$, and/or $C_2F_6$), a chlorine-containing gas (such as $Cl_2$, $CHCl_3$, $CCl_4$, and/or $BCl_3$), a bromine-containing gas (such as HBr and/or $CHBR_3$), an iodine-containing gas, another suitable gas or plasma, or a combination thereof.

Next, epi regions are formed in the active area of the substrate 102 between the gate structures 103 (now shown). In some embodiments, epi regions may be P-type. P-type epi regions may include SiGe and may be in-situ doped during an epitaxial growth process using P-type dopants such as, boron, indium, or gallium. For P-type in-situ doping, P-type doping precursors such as diborane ($B_2H_6$), boron trifluoride ($BF_3$) and/or other P-type doping precursors may be used. In some other embodiments, epi regions may be N-type. N-type epi regions may include SiP and may be in-situ doped during an epitaxial growth process using N-type dopants such as, phosphorus or arsenic. For N-type in-situ doping, n-type doping precursors such as phosphine ($PH_3$), arsine ($AsH_3$), and/or other n-type doping precursor may be used.

Next, a contact etch stop layer (CESL) is formed on the gate structures 103 and the substrate 102 (not shown). In some embodiments, the CESL may include silicon nitride ($Si_xN_y$), silicon oxynitride ($SiO_xN_y$), carbon-doped silicon oxide ($SiC_xO_y$), carbon-doped silicon nitride ($SiC_xN_y$), another suitable material, or a combination thereof. The CESL may be conformally formed on the gate structures 103 and the substrate 102 by LPCVD, PECVD, HDP-CVD, APCVD, ATD, another suitable deposition method, or a combination thereof.

Figure 3A:
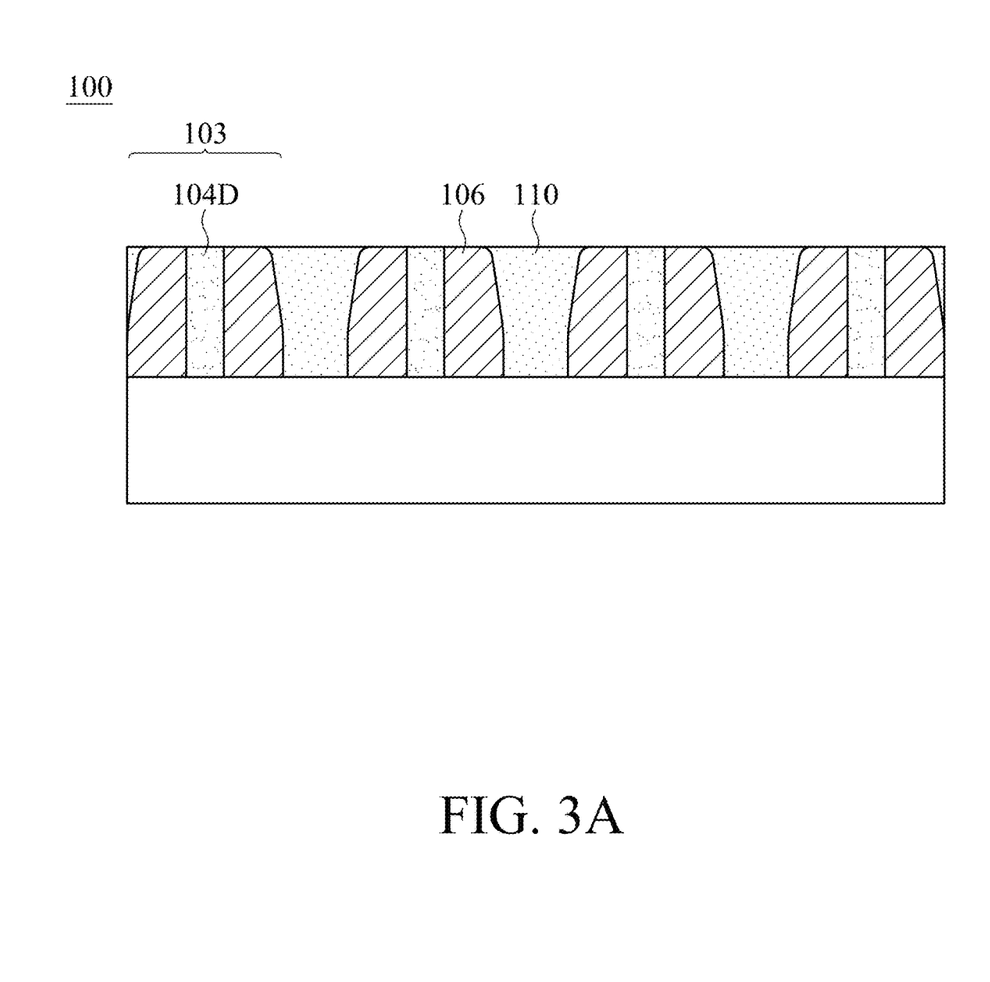
Figure 3B:
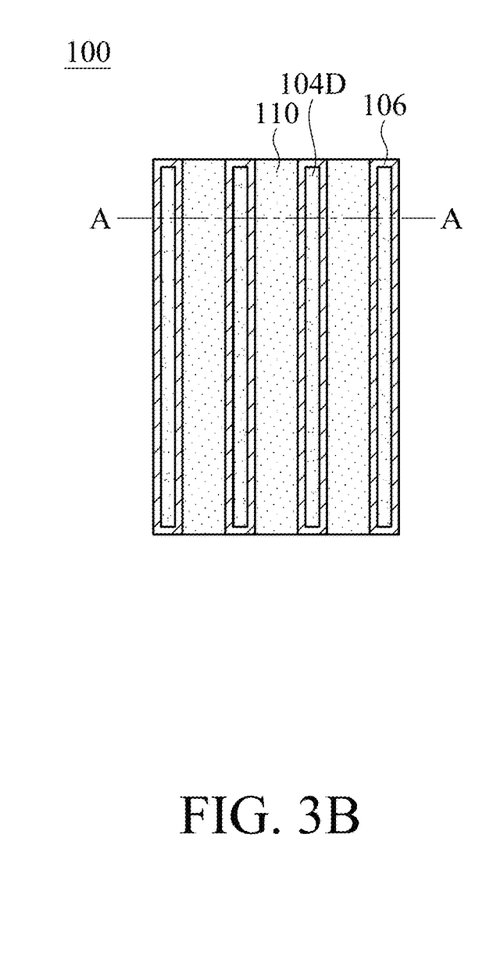

Next, as shown in FIGS. 1, 3A, and 3B, the method 10 proceeds to step 14, in which a sacrificial layer 110 is formed between the gate structures 103. In some embodiments, the sacrificial layer 110 may include polysilicon, SiGe, doped polysilicon (for example, polysilicon doped by fluorine), doped SiGe (for example, SiGe doped by boron), another material which can be selectively etched in the subsequent process, or a combination thereof. In some embodiments, the sacrificial layer 110 may be selectively etched relative to oxides and nitrides in the subsequent process. In some embodiments, the sacrificial layer 110 may be formed on the substrate 102 between the gate structures 103 using chemical vapor deposition (CVD) (such as high density plasma chemical vapor deposition (HDPCVD), atmospheric pressure chemical vapor deposition (APCVD), low-pressure chemical vapor deposition (LPCVD), or plasma enhanced chemical vapor deposition (PECVD)), atomic layer deposition (ALD), physical vapor deposition (PVD), electroplating, spin-on coating, another suitable deposition process, or a combination thereof.

Next, a planarization process such as a chemical mechanical polishing (CMP) process or an etch-back process is performed on the gate structures 103 and the sacrificial layer 110. Since the self-aligned contacts will be formed in the subsequent process in the location where parts of the sacrificial layer 110 is formed, the distance between the sacrificial layer 110 and the dummy gate 104D is critical. If the distance between the sacrificial layer 110 and the dummy gate 104D is too short, it may cause electrical short-circuits or increases in the Cgd capacitance. If the distance between the sacrificial layer 110 and the dummy gate 104D is too long, the contact resistance may increase when the gate pitch is the same.

Figure 4A:
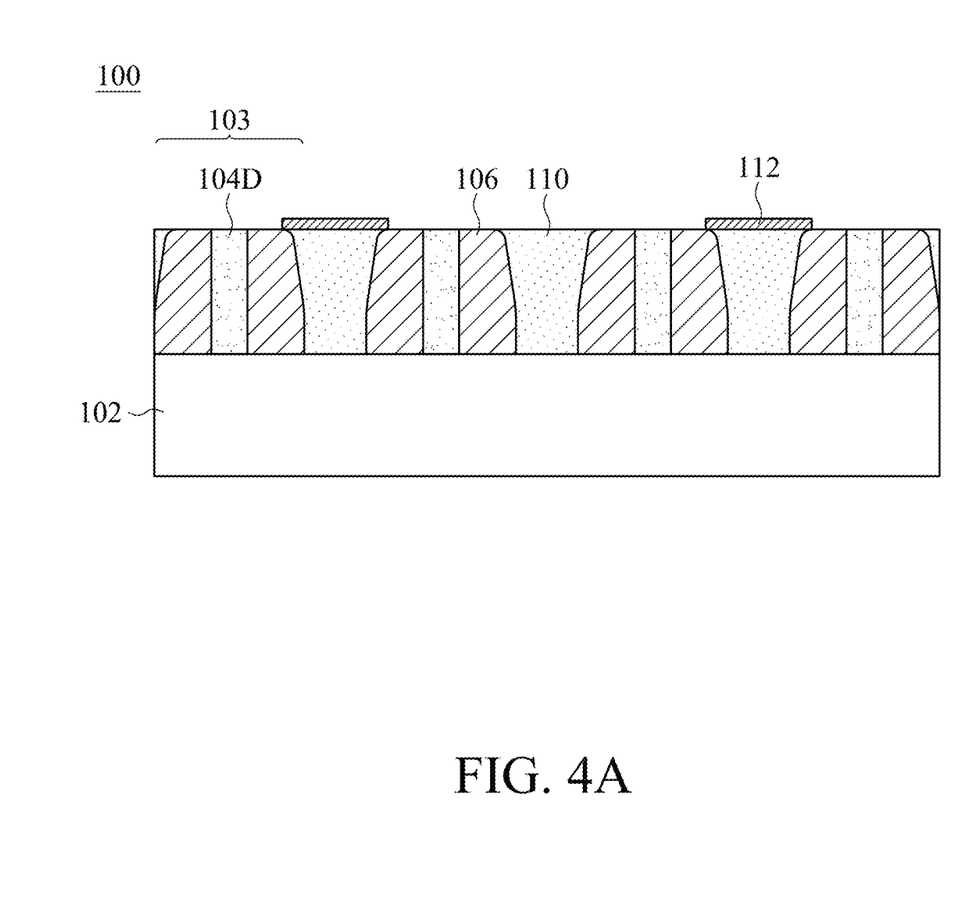
Figure 4B:
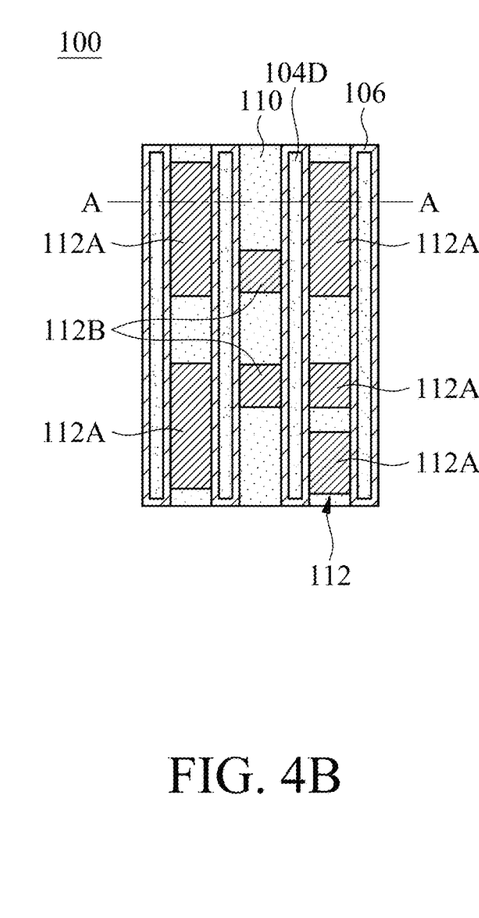

Next, as shown in FIGS. 1, 4A, and 4B, the method 10 proceeds to step 16, in which a mask layer 112 is formed on a part of the sacrificial layer 110. In some embodiments, the mask layer 112 may include silicon nitride, silicon oxide, TiN, other applicable materials, or a combination thereof. The mask layer 112 may be formed using a low-pressure chemical vapor deposition (LPCVD) process, a plasma-enhanced chemical vapor deposition (PECVD) process, another suitable process, or a combination thereof. In some embodiments, as shown in FIG. 4B, the mask layer 112 is patterned to form desired patterns between the gate structures 103. The process of patterning the mask layer 112 may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process (e.g., an anisotropic plasma etching method), a wet etching process, or a combination thereof. In some embodiments, the mask layer 112 is formed by a single photomask. In some other embodiments, the mask layer 112 is formed by two separate photomasks. For example, as shown in FIG. 4B, the first portion 112A of the mask layer 112 is formed with a first photomask, and the second portion 112B of the mask layer 112 is formed with a second photomask. Forming the mask layer 112 with multiple photomasks is beneficial when the pitch of the mask layer 112 is small, since this method may overcome the limitations of small spaces on the photomasks. It should be noted that, although there are two photomasks used in the embodiments shown in FIG. 4B, the number of photomasks is not limited thereto. More than two photomasks may be used when forming the mask layer 112.

Figure 5A:
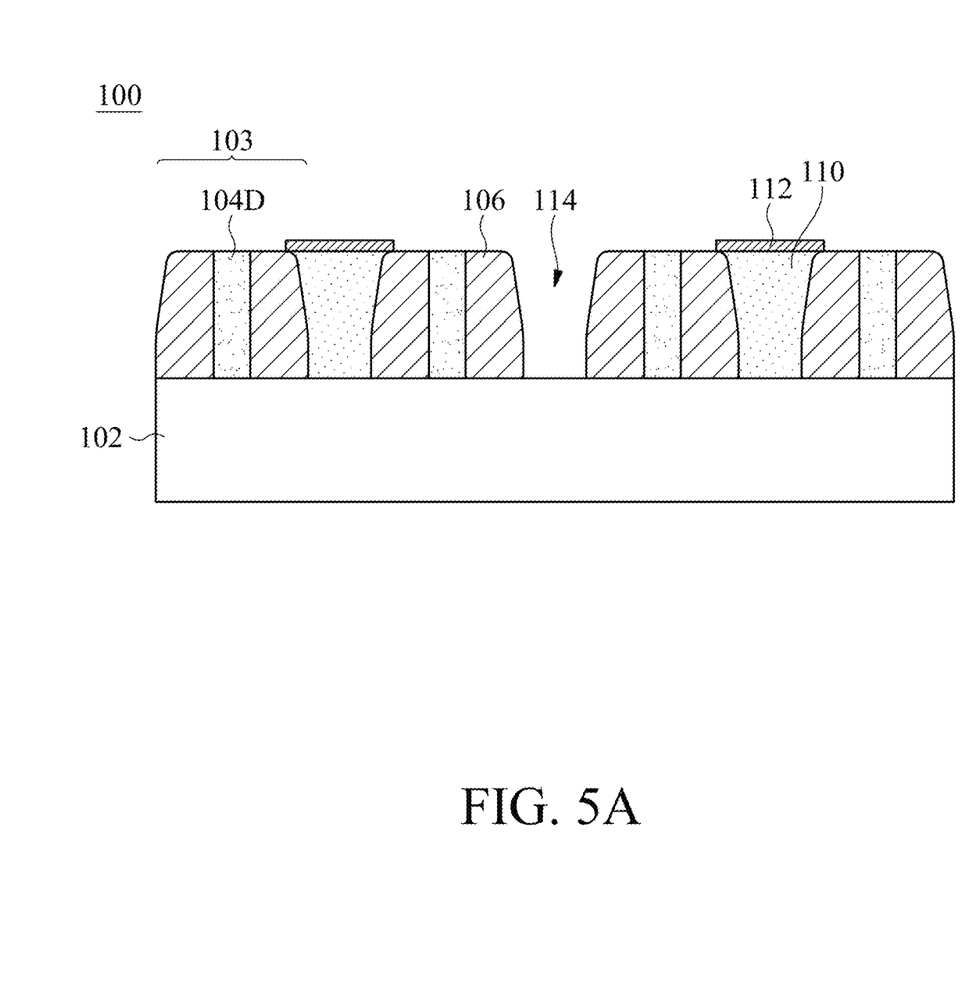
Figure 5B:
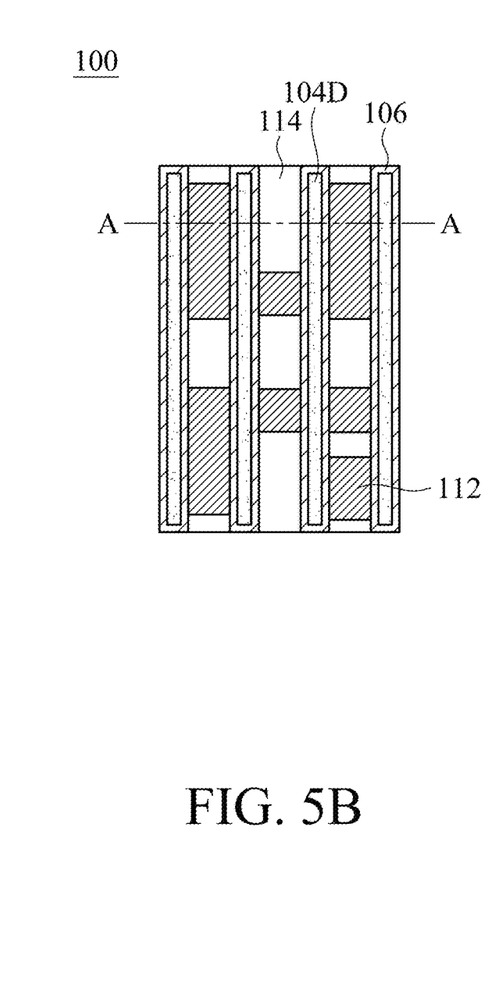

Next, as shown in FIGS. 1, 5A, and 5B, the method 10 proceeds to step 18, in which the first openings 114 are formed by removing the sacrificial layer 110 exposed from the mask layer 112. In some embodiments, the sacrificial layer 110 is removed by an etching process. The etching process may be a dry etching process, a wet etching process, a reactive ion etching process, or another suitable etching process. In some embodiments, the dry etching process may be performed using an oxygen-containing gas, a fluorine-containing gas (such as $CF_4$, $SF_6$, $CH_2F_2$, $CHF_3$, and/or $C_2F_6$), a chlorine-containing gas (such as $Cl_2$, $CHCl_3$, $CCl_4$, and/or $BCl_3$), a bromine-containing gas (such as HBr and/or $CHBR_3$), an iodine-containing gas, another suitable gas or plasma, or a combination thereof. In some embodiments, the wet etching process may be performed in wet-etching etchant such as phosphoric acid based ($H_3PO_4$), diluted hydrofluoric acid (DHF), potassium hydroxide (KOH), ammonia, hydrofluoric acid (HF), nitric acid ($HNO_3$), acetic acid ($CH_3COOH$), another suitable wet-etching etchant, or a combination thereof.

Figure 6A:
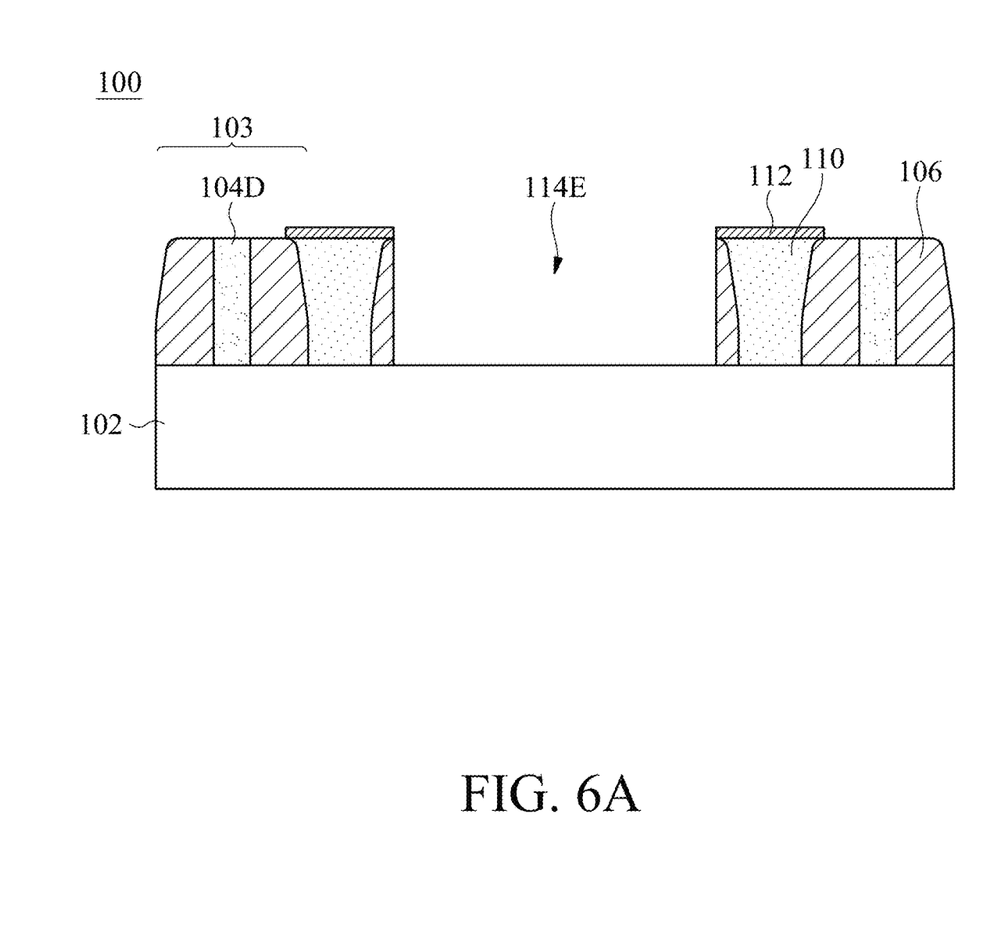
Figure 6B:
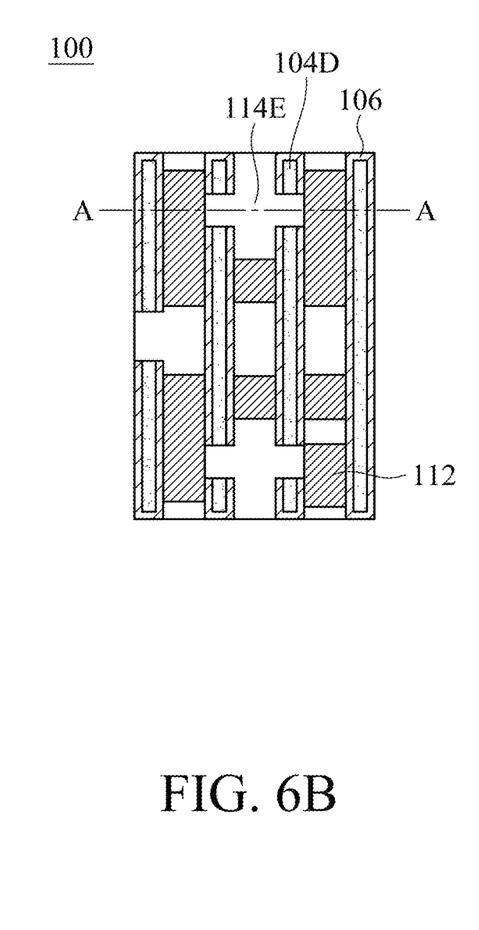

Next, as shown in FIGS. 6A and 6B, parts of the gate structures 103 are removed to form the desired pattern on the gate structures 103 from a top view. Parts of the gate structures 103 are removed in a photolithography and etching process. The photolithography process may include photoresist coating (e.g., spin-on coating), soft baking, mask aligning, pattern exposure, post-exposure baking, photoresist development, and rinsing and drying (e.g., hard baking), etc. The etching process may include a dry etching process (e.g., reactive ion etching (RIE), anisotropic plasma etching method), a wet etching process, or a combination thereof. After parts of the gate structures 103 are removed, some of the first openings 114 may be the same as before, and some of the first openings 114 may be expanded as the first openings 114E shown in FIGS. 6A and 6B. By removing parts of the gate structures 103 to form the desired pattern of the gate structures 103 instead of forming the desired pattern of the gate structures 103 directly, the gate structures 103 may be more uniform.

Figure 7A:
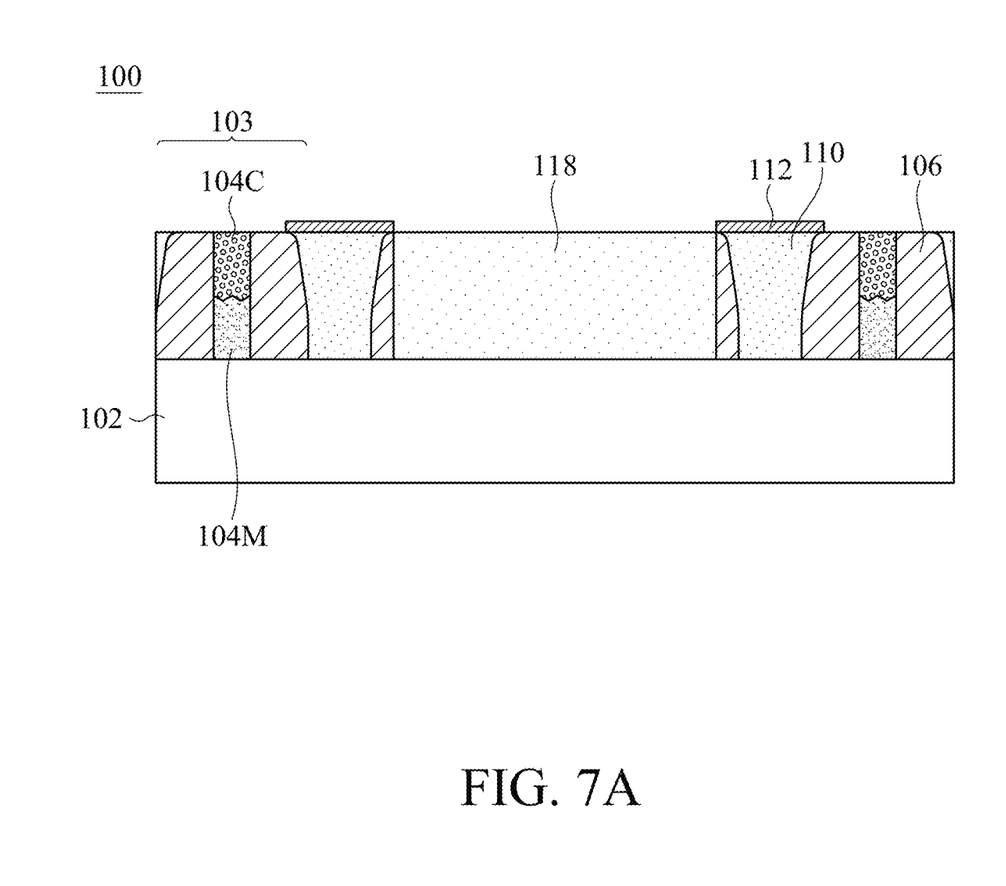
Figure 7B:
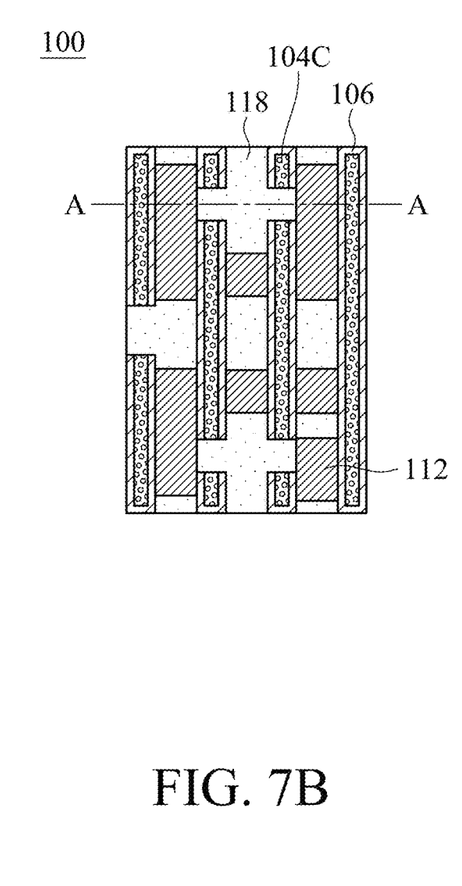

Next, as shown in FIGS. 1, 7A, and 7B, the method 10 proceeds to step 20, in which a dielectric layer 118 is formed in the first openings 114 and 114E. In some embodiments, the dielectric layer 118 may include dielectric materials such as silicon oxide, silicon nitride, silicon oxynitride, tetra-ethoxysilane (TEOS), phosphosilicate glass (PSG), boro-phosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), polyimide, or a combination thereof. The dielectric layer 118 may be formed using a chemical vapor deposition (CVD) process (e.g., a high-density plasma chemical vapor deposition (HDPCVD) process, an atmospheric pressure chemical vapor deposition (APCVD) process, a low-pressure chemical vapor deposition (LPCVD) process, a plasma enhanced chemical vapor deposition (PECVD) process), a spin-on coating process, an atomic layer deposition process, another applicable process, or a combination thereof. After the dielectric layer 118 is deposited, a planarization process (e.g., a chemical mechanical polishing process or an etching back process) may optionally be performed to remove the excess dielectric materials.

Next, as shown in FIGS. 7A and 7B, the dummy gates 104D are replaced with a metal gate 104M and an overlying gate cap layer 104C. The dummy gates 104D are removed using an anisotropic vertical etch process such as reactive ion etch (RIE) or a dry etching process, and an opening between the spacers 106 is formed (not shown). In some embodiments, the dry etching process may be performed using an oxygen-containing gas, a fluorine-containing gas (such as $CF_4$, $SF_6$, $CH_2F_2$, $CHF_3$, and/or $C_2F_6$), a chlorine-containing gas (such as $Cl_2$, $CHCl_3$, $CCl_4$, and/or $BCl_3$), a bromine-containing gas (such as HBr and/or CHBR$_3$), an iodine-containing gas, another suitable gas or plasma, or a combination thereof. A gate dielectric layer is then formed in the opening between the spacers 106 (not shown). The gate dielectric layer may include silicon oxide. The silicon oxide may be formed using an oxidation process (e.g., a dry oxidation process or a wet oxidation process), a chemical vapor deposition process, another applicable process, or a combination thereof. Alternatively, the gate dielectric layer may include a high-k dielectric layer (e.g., one with a dielectric constant that is greater than 3.9) such as hafnium oxide (HfO$_2$). Alternatively, the high-k dielectric layer may include other high-k dielectrics, such as LaO, AlO, ZrO, TiO, Ta$_2$O$_5$, Y$_2$O$_3$, SrTiO$_3$, BaTiO$_3$, BaZrO, HfZrO, HfLaO, HfTaO, HfSiO, HfSiON, HfSiO, LaSiO, AlSiO, (Ba, Sr)TiO$_3$, Al$_2$O$_3$, or a combination thereof. The high-k dielectric layer may be formed using a chemical vapor deposition process (e.g., a plasma enhanced chemical vapor deposition (PECVD) process or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process or a sputtering process), another applicable process, or a combination thereof.

Next, metal gate 104M is formed in the opening between the spacers 106 on the gate dielectric layer. The metal gate 104M may include metal gate materials such as a single layer of TiN, TaN, TaAlC, TiC, TaC, Co, Al, TiAl, HfTi, TiSi, TaSi, or TiAlC, or two or more layers thereof. For an N-type FET, one or more layers of TaN, TaAlC, TiN, TiC, Co, TiAl, HfTi, TiSi, and TaSi may be formed as the metal gate 104M. For a P-type FET, one or more layers of TiAlC, Al, TiAl, TaN, TaAlC, TiN, TiC, or Co may be formed as the metal gate 104M. In some embodiments, the metal gate 104M may be formed by conformally depositing the metal gate materials in the opening between the spacers 106 using a chemical vapor deposition process (e.g., a low-pressure chemical vapor deposition process or a plasma enhanced chemical vapor deposition process), a physical vapor deposition process (e.g., a vacuum evaporation process or a sputtering process), another applicable process, or a combination thereof. In some embodiments, the metal gate material is then recessed to form a recess in the opening between the spacers 106 (not shown).

Next, a gate cap layer 104C is formed in the recess between the spacers 106 on the metal gate 104M. The gate cap layer 104C may include silicon nitride. In some embodiments, the gate cap layer 104C may be formed on the metal gate 104M by low-pressure chemical vapor deposition (LPCVD), plasma enhanced chemical vapor deposition (PECVD), another suitable deposition process, or a combination thereof. After the gate cap layer 104C is deposited, a planarization process (e.g., a chemical mechanical polishing process or an etching back process) may optionally be performed to remove the excess dielectric materials.

Figure 8A:
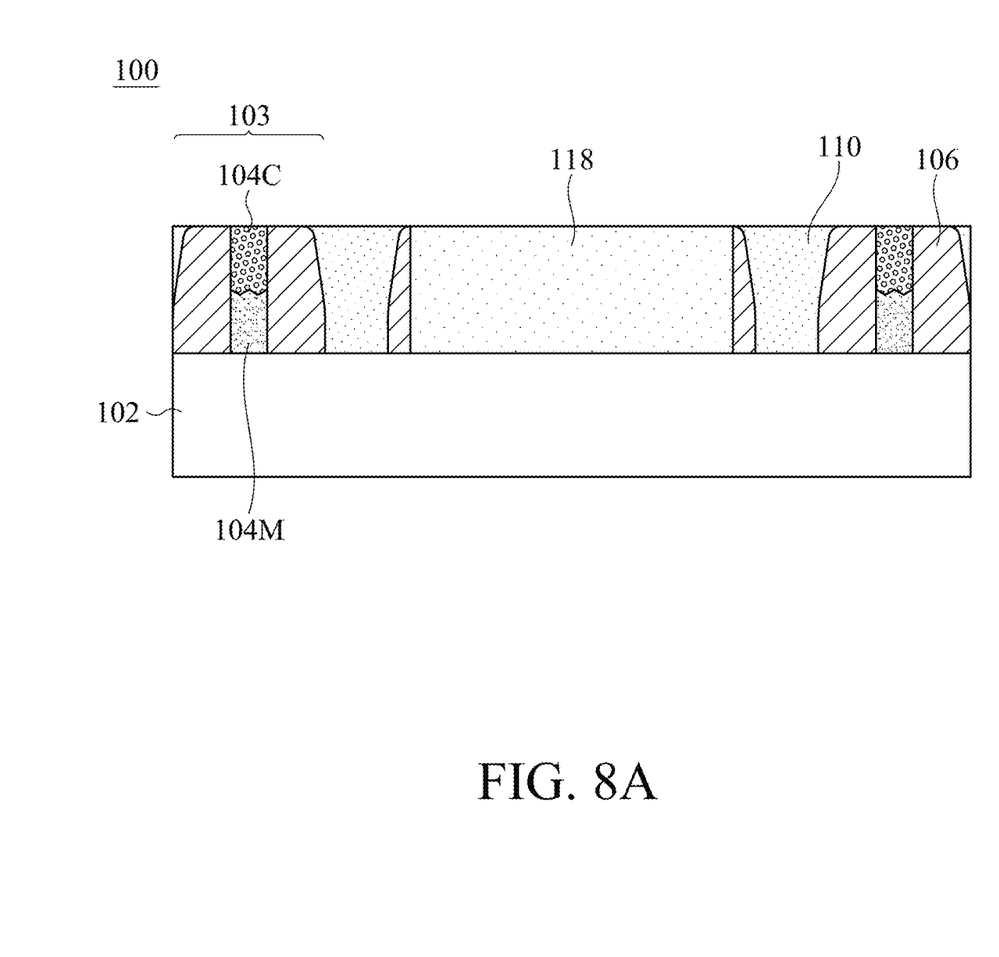
Figure 8B:
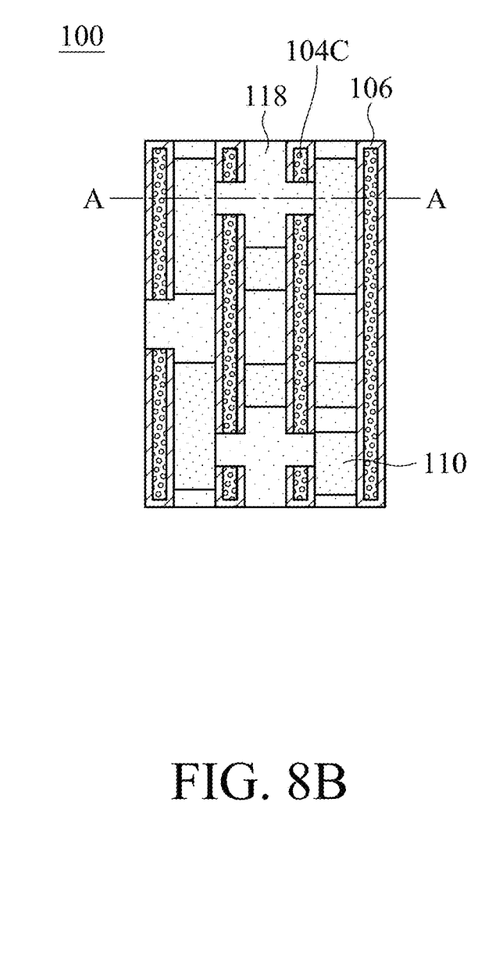

Next, as shown in FIGS. 1, 8A, and 8B, the method 10 proceeds to step 22, in which the mask layer 112 is removed. The mask layer may be removed using an etching process such as a dry etching process (e.g., an anisotropic plasma etching method), a wet etching process, or a combination thereof. After the mask layer 112 is removed, the sacrificial layer 110 remaining on the substrate 120 is exposed.

Figure 9A:
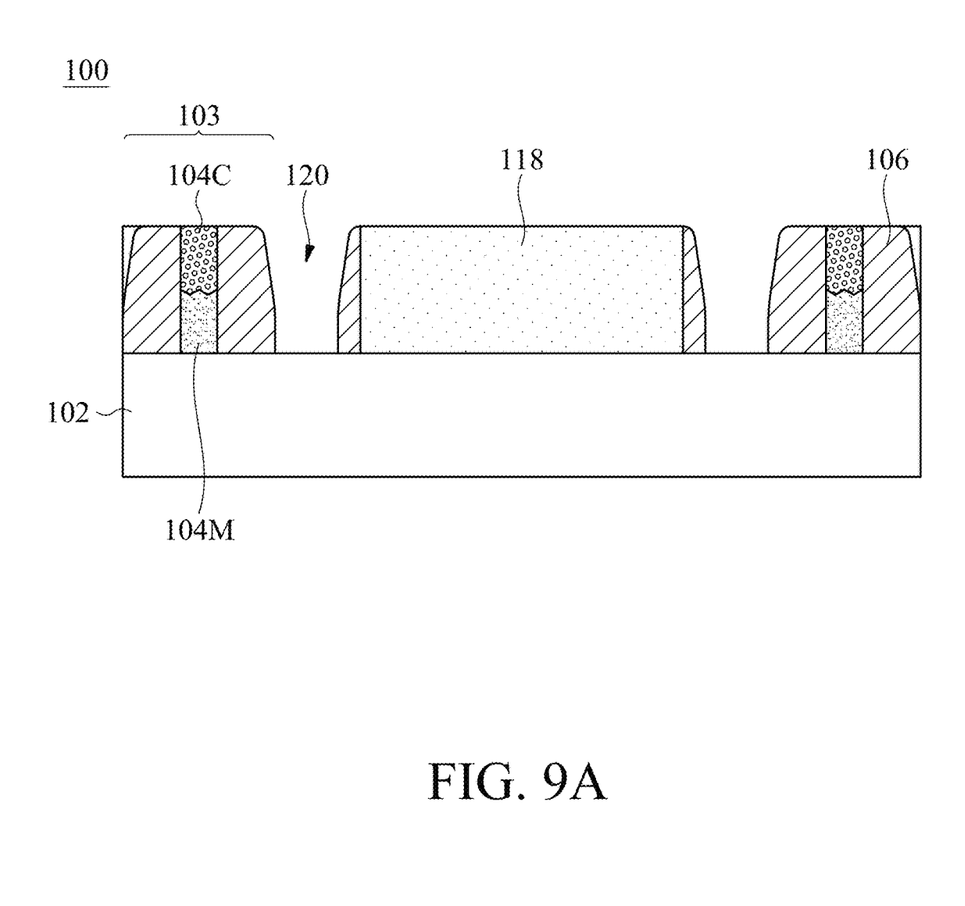
Figure 9B:
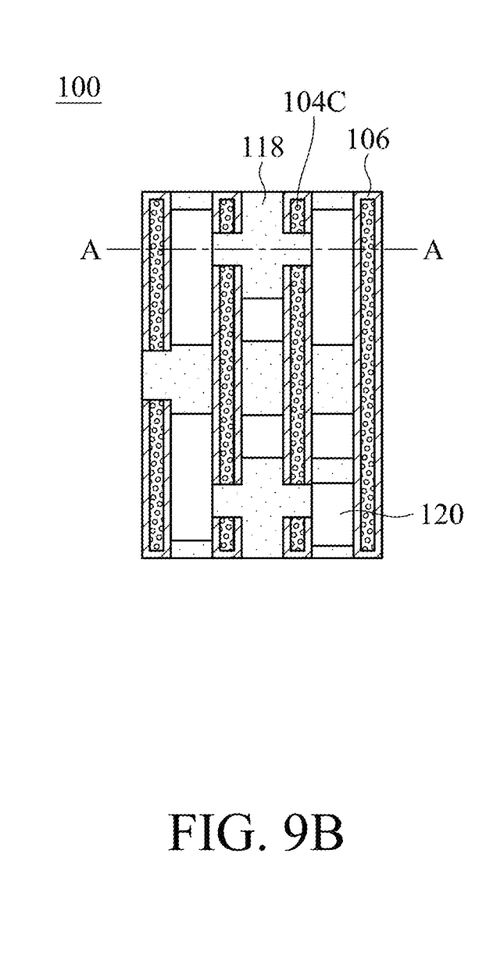

Next, as shown in FIGS. 1, 9A, and 9B, the method 10 proceeds to step 24, in which second openings 120 are formed by removing the sacrificial layer 110 remaining on the substrate 102. In some embodiments, the sacrificial layer 110 is removed using a selective etching process relative to the dielectric layer 118, the gate cap layer 104C, and the spacers 106. For example, the sacrificial layer 110 is removed using a selective etching process relative to oxide and nitride. The etching process may include a dry etching process, a wet etching process, a reactive ion etching process, or another suitable etching process. In some embodiments, the dry etching process may be performed using an oxygen-containing gas, a fluorine-containing gas (such as CF$_4$, SF$_6$, CH$_2$F$_2$, CHF$_3$, and/or C$_2$F$_6$), a chlorine-containing gas (such as Cl$_2$, CHCl$_3$, CCl$_4$, and/or BCl$_3$), a bromine-containing gas (such as HBr and/or CHBR$_3$), an iodine-containing gas, another suitable gas or plasma, or a combination thereof. In some embodiments, the wet etching process may be performed in wet-etching etchant such as diluted hydrofluoric acid (DHF), potassium hydroxide (KOH), ammonia, hydrofluoric acid (HF), nitric acid (HNO$_3$), acetic acid (CH$_3$COOH), another suitable wet-etching etchant, or a combination thereof. Since the sacrificial layer 110 is removed using a selective etching process, the dielectric layer 118, the gate cap layer 104C, and the spacers 106 may not be damaged during the selective etching process.

Figure 10A:
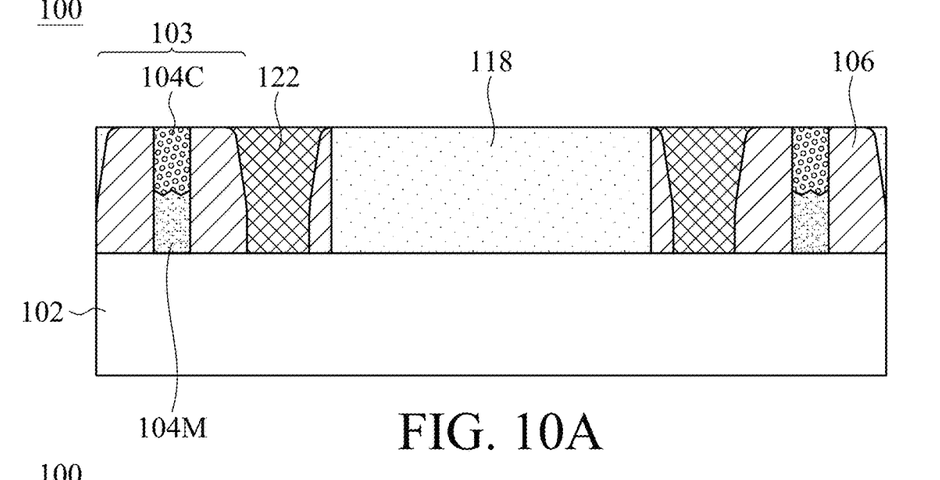
Figure 10B:
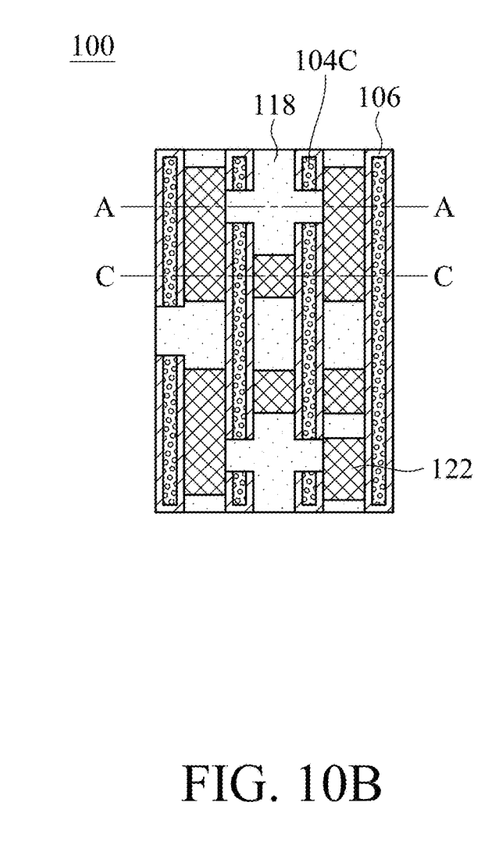

Next, as shown in FIGS. 1, 10A, and 10B, the method 10 proceeds to step 24, in which first contact plugs 122 are formed in the second openings 120. The first contact plugs 122 can be made of metal materials (e.g., W, Al, or Cu), metal alloys, poly-Si, other applicable conductive materials, and combinations thereof. The first contact plugs 122 can be formed by using a chemical vapor deposition process (CVD), a physical vapor deposition process (PVD, e.g., evaporation or sputtering), an atomic layer deposition process (ALD), an electroplating process, another suitable process, or a combination thereof to deposit the conductive materials of the first contact structure, and then optionally performing a chemical mechanical polishing (CMP) process or an etching back process to remove the excess conductive materials.

Figure 10C:
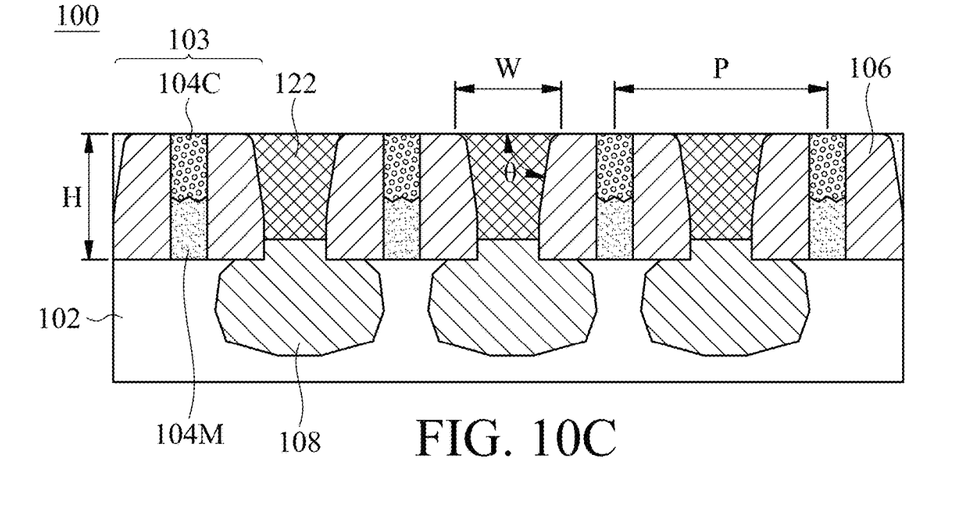
FIGS. 10C and 11C are cross-sectional representations of a self-aligned contact in accordance with some embodiments.

FIG. 10C is a cross-sectional view of some embodiments of the self-aligned contact, taken along line C-C in FIG. 10B. As shown in FIG. 10C, epi regions 108 are formed in the active area of the substrate 102 between the gate structures 103. As shown in FIG. 10C, the first contact plugs 122 formed between the gate structures 103 are symmetrical. If the first contact plugs 122 are not symmetrical between the gate structures 103, the distance between the first contact plugs 122 and the gate structures 103 may be shorter on one side, and the capacitance between the gate and the drain may increase. Variations of the capacitance may also be minimized by using symmetrical first contact plugs 122. In addition, the spacers 106 may have a planar top surface and the first contact plugs 122 are not formed on the top of the spacers 106. This may keep the first contact plugs 122 apart from the metal gate 104M and the gate cap layer 104C and may help to decrease the capacitance between the gate and the drain. Moreover, the angle θ between the sidewalls and the top surface of the first contact plugs 122 is greater than 70°, preferably is substantially 90°. When the angle θ is too small, the distance between the first contact plugs 122 and the metal gate 104M and the gate cap layer 104C may be too close, and the capacitance between the gate and the drain may increase. In addition, the maximum width W of the first contact plugs 122 is less than or equal to 33% of the pitch P of the gate structures 103. If the maximum width W of the first contact plugs 122 is too wide, which means the first contact plugs 122 are too close to the metal gate 104M and the gate cap layer 104C, the capacitance between the gate and the drain may increase. Therefore, using the method for forming the self-aligned contact 100 that was described above, the first contact plugs 122 are apart from the metal gate 104M and the gate cap layer 104C. Short-circuits may be prevented and the capacitance between the gate and the drain is decreased and has less variation. Moreover, in some embodiments, the gate structures 103 have a height H (including the height of the gate cap layer 104C), which is in a range of 100% to 150% of the pitch P of the gate structures 103.

Figure 11A:
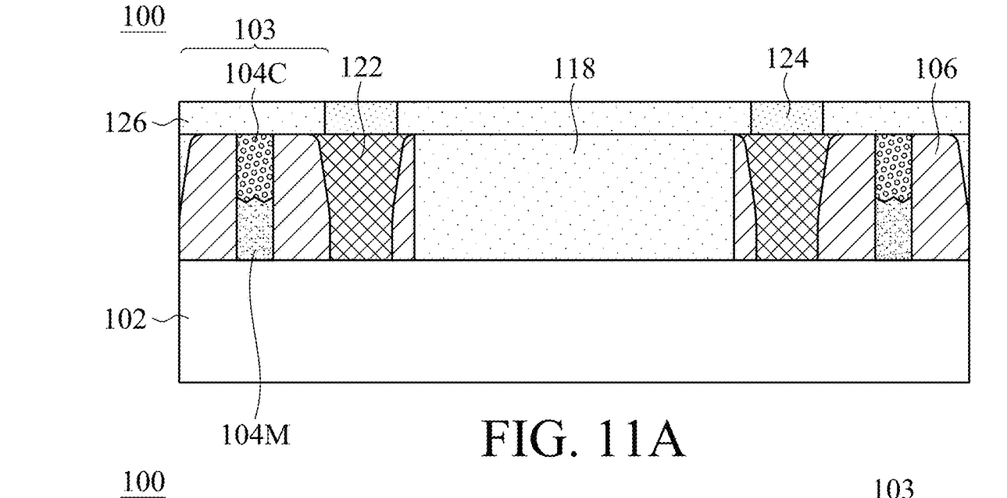
Figure 11B:
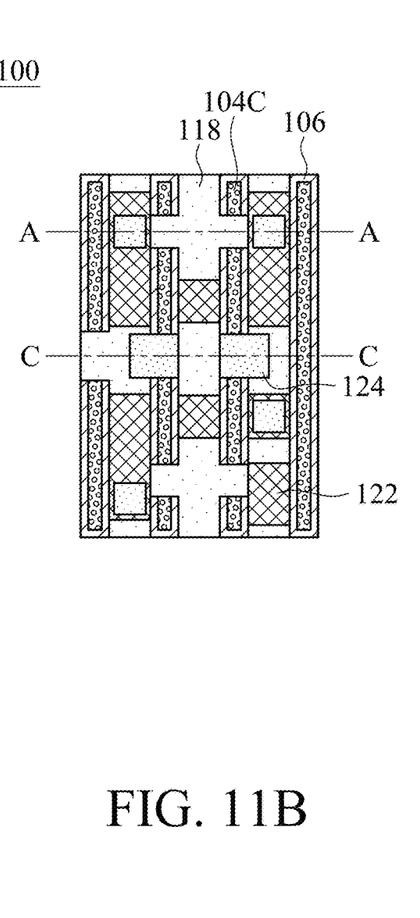
Figure 11C:
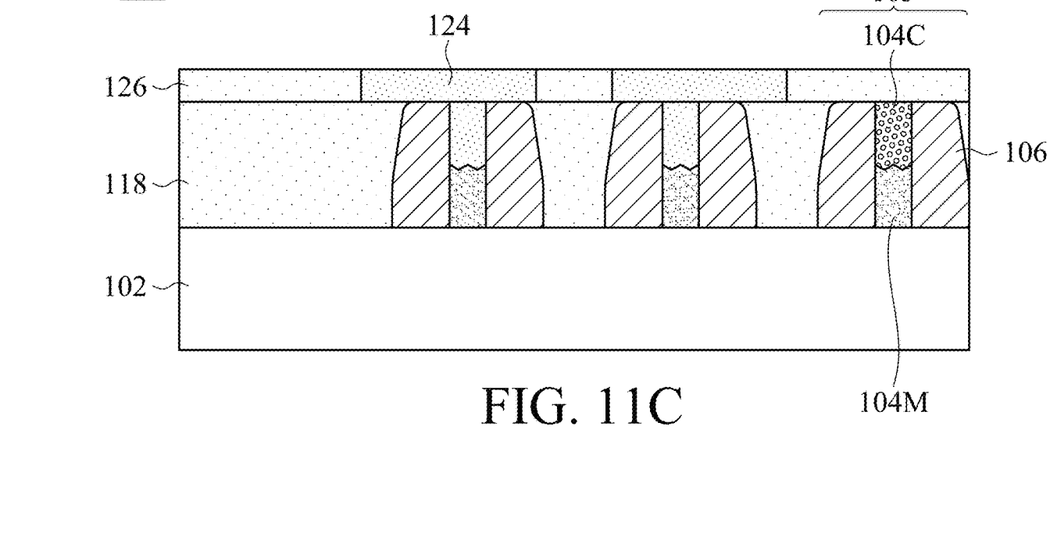

Next, as shown in FIGS. 11A-11C, second contact plugs 124 are formed on the gate structures 103 and the first contact plugs 122. FIG. 11C is a cross-sectional view of some embodiments of the self-aligned contact, taken along line C-C in FIG. 11B. In some embodiments, the second contact plugs 124 may include Ti, Al, Au, Pd, Cu, W, another suitable metal, metal alloys, poly-Si, another applicable conductive material, or a combination thereof. As shown in FIG. 11C according to some embodiments, the gate cap layer 104C is removed and a recess is formed, and then the contact material is formed in the recess and on the gate structures 103 first by chemical vapor deposition (CVD), physical vapor deposition (PVD) (e.g., resistive heating evaporation or sputtering), electroplating, atomic layer deposition (ALD), another suitable method, or a combination thereof. The electrode material is then patterned using a photolithography and etching process to form the second contact plugs 124. Next, as shown in FIGS. 11A and 11C, a dielectric layer 126 is formed surrounding the second contact plugs 124. Some processes and materials used to form the dielectric layer 126 may be similar to, or the same as, those used to form the dielectric layer 118 and are not repeated herein. For the purpose of clarity, the dielectric layer 126 is not shown in FIG. 11B and the structures underneath are presented.

As mentioned above, in the present disclosure, a method of forming a self-aligned contact is provided. With a self-aligned sacrificial layer formed at the positions where the contacts between the gate structures are to be formed, the size of the contacts may be controlled and the contacts may be kept apart from the gate structures. Therefore, the capacitance between the gate and the drain may be reduced and capacitance variations may be minimized.

It should be noted that although some of the benefits and effects are described in the embodiments above, not every embodiment needs to achieve all the benefits and effects.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A self-aligned contact, comprising:
a plurality of gate structures on a substrate, the plurality of gate structures including spacers on opposite sides of a gate structure;
a dielectric layer disposed between the plurality of gate structures; and
a plurality of first contact plugs disposed between the plurality of gate structures in the dielectric layer;
wherein the spacers have a planar top surface, and
wherein a top surface of the plurality of gate structures, a top surface of the dielectric layer and a top surface of the plurality of first contact plugs are co-planar,
wherein the spacers comprise a first spacer, the plurality of gate structures comprises a first gate structure and the plurality of first contact plugs comprises a first contact plug,
wherein the first gate structure comprises a first metal gate, and
wherein the first spacer directly contacts the first metal gate and the first contact plug,
wherein the self-aligned contact further comprises second spacers between the dielectric layer and the plurality of first contact plugs.

2. The self-aligned contact as claimed in claim 1, wherein the plurality of first contact plugs between the plurality of gate structures are symmetrical.

3. The self-aligned contact as claimed in claim 1, wherein an angle between any portion of sidewalls and the top surface of the plurality of first contact plugs is greater than 70°.

4. The self-aligned contact as claimed in claim 1, wherein a maximum width of the plurality of first contact plugs is less than or equal to 33% of a pitch of the plurality of gate structures.

5. The self-aligned contact as claimed in claim 1, wherein a height of the plurality of gate structures is in a range of 100% to 150% of a pitch of the plurality of gate structures.

6. The self-aligned contact as claimed in claim 1, wherein each gate structure of the plurality of gate structures comprises a gate cap layer on a metal gate.

7. The self-aligned contact as claimed in claim 1, wherein the dielectric layer comprises silicon oxide, silicon nitride, silicon oxynitride, tetraethoxysilane (TEOS), phosphosilicate glass (PSG), borophosphosilicate glass (BPSG), fluorinated silica glass (FSG), carbon doped silicon oxide, amorphous fluorinated carbon, parylene, bis-benzocyclobutenes (BCB), or polyimide, or a combination thereof.

8. The self-aligned contact as claimed in claim 1, wherein the plurality of first contact plugs comprises a metal material.

9. The self-aligned contact as claimed in claim 1, further comprising second contact plugs on the plurality of first contact plugs.

10. The self-aligned contact as claimed in claim 9, further comprising a second dielectric layer surrounding the second contact plugs.

11. The self-aligned contact as claimed in claim 1, wherein the planar top surface is co-planar with the top surface of the plurality of gate structures, the top surface of the dielectric layer and the top surface of the plurality of first contact plugs.

12. The self-aligned contact as claimed in claim 10, wherein a bottom surface of the spacers and the second spacers are co-planar with a bottom surface of the plurality of gate structures, a bottom surface of the dielectric layer and a bottom surface of the plurality of first contact plugs.

13. The self-aligned contact as claimed in claim 1, wherein a bottom surface of the plurality of gate structures are co-planar with a bottom surface of the dielectric layer and a bottom surface of the plurality of first contact plugs.

* * * * *